(12) United States Patent
Takada et al.

(10) Patent No.: US 11,002,794 B2
(45) Date of Patent: May 11, 2021

(54) CONTROL APPARATUS OF POWER SUPPLY SYSTEM

(71) Applicant: SUBARU CORPORATION, Tokyo (JP)

(72) Inventors: Takumi Takada, Tokyo (JP); Koji Uehara, Tokyo (JP); Hideaki Ishihara, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 263 days.

(21) Appl. No.: 16/401,972

(22) Filed: May 2, 2019

(65) Prior Publication Data

US 2019/0377030 A1    Dec. 12, 2019

(30) Foreign Application Priority Data

Jun. 6, 2018    (JP) .............................. JP2018-108206

(51) Int. Cl.
| H02J 7/00 | (2006.01) |
|---|---|
| G01R 31/3835 | (2019.01) |
| H02J 7/14 | (2006.01) |

(52) U.S. Cl.
CPC ........ *G01R 31/3835* (2019.01); *H02J 7/0063* (2013.01); *H02J 7/1446* (2013.01); *H02J 2007/0067* (2013.01)

(58) Field of Classification Search
None
See application file for complete search history.

(56) References Cited

U.S. PATENT DOCUMENTS

| 8,093,902 | B2* | 1/2012 | Nishi | G01R 31/367 |
|---|---|---|---|---|
| | | | | 324/427 |
| 2007/0139015 | A1* | 6/2007 | Seo | G01R 31/3828 |
| | | | | 320/132 |
| 2010/0007506 | A1* | 1/2010 | Fischer | H02J 7/027 |
| | | | | 340/636.1 |
| 2010/0026243 | A1* | 2/2010 | Tatsumi | H02J 7/1446 |
| | | | | 320/132 |
| 2013/0151087 | A1* | 6/2013 | Doi | G01R 31/367 |
| | | | | 701/50 |

(Continued)

FOREIGN PATENT DOCUMENTS

JP    2016-116255 A    6/2016

*Primary Examiner* — Arun C Williams
(74) *Attorney, Agent, or Firm* — McDermott Will & Emery LLP

(57) ABSTRACT

A control apparatus of a power supply system including a battery, a battery sensor to detect a state quantity of the battery, and a generator to generate a power for the battery includes a controller. The controller executes normal charging control to control battery charging based on a detection result from the battery sensor, by controlling an operation of the generator. The controller executes failsafe control to prioritize battery charging regardless of the detection result from the battery sensor, if the battery sensor is determined to be operating abnormally. The controller executes full charging control to charge the battery until the battery is fully charged, when the failsafe control ends. The controller executes the normal charging control after a state-of-charge of the battery used in the normal charging control is set to a value corresponding to a state where the battery is fully charged, when the full charging control ends.

17 Claims, 6 Drawing Sheets

(56) References Cited

U.S. PATENT DOCUMENTS

| | | | |
|---|---|---|---|
| 2014/0365099 A1* | 12/2014 | Tochigi | F02D 17/04 |
| | | | 701/99 |
| 2015/0168499 A1* | 6/2015 | Palmisano | G01R 31/385 |
| | | | 702/65 |
| 2016/0211684 A1* | 7/2016 | Tsurumaru | H02J 7/0029 |
| 2019/0184846 A1* | 6/2019 | Kang | B60L 58/12 |

* cited by examiner

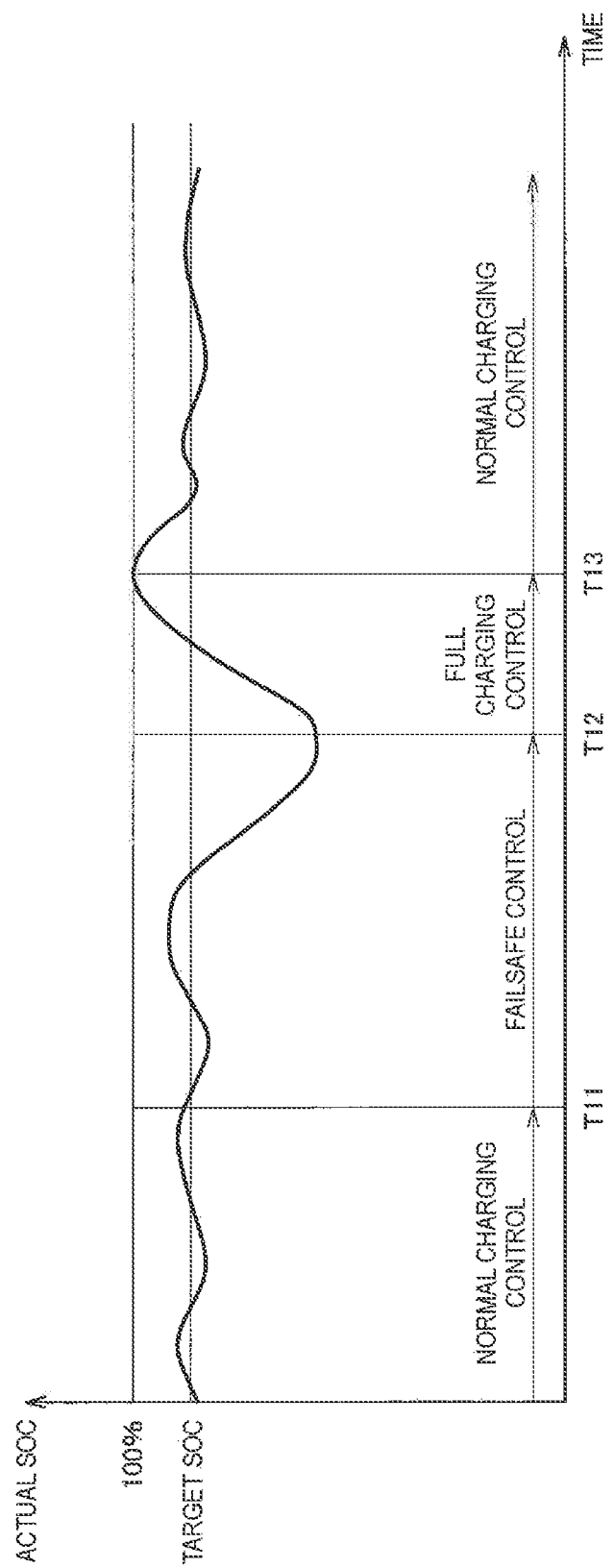

CONTROL APPARATUS OF POWER SUPPLY SYSTEM

CROSS-REFERENCE TO RELATED APPLICATIONS

The present application claims priority from Japanese Patent Application No. 2018-108206 filed on Jun. 6, 2018, the entire contents of which are hereby incorporated by reference.

BACKGROUND

The disclosure relates to a control apparatus of a power supply system.

In the past, a battery and generator (e.g., an alternator) are provided as a power supply system mounted in a vehicle or the like, and the battery is charged using electric power generated by the generator. Control of charging such a battery (hereinafter, also referred to as "charging control") is generally performed on the basis of detection results from a battery sensor that detects state quantities such as voltage and current of the battery, as disclosed in Japanese Unexamined Patent Application Publication No. 2016-116255, for example.

SUMMARY

An aspect of the disclosure provides a control apparatus of a power supply system. The power supply system includes a battery, a battery sensor configured to detect a state quantity of the battery, and a generator configured to generate a power to be supplied to the battery. The control apparatus includes a controller configured to execute a normal charging control to control a charging of the battery on the basis of a detection result from the battery sensor, by controlling an operation of the generator. The controller executes a failsafe control to prioritize charging the battery regardless of the detection result from the battery sensor, in a case where the battery sensor is determined to be operating abnormally. The controller executes a full charging control to charge the battery until the battery is fully charged, when the failsafe control ends. The controller executes the normal charging control after a value of a state-of-charge of the battery used in the normal charging control is set to a value corresponding to a state where the battery is fully charged, when the full charging control ends.

An aspect of the disclosure provides a control apparatus of a power supply system. The power supply system includes a battery, a battery sensor configured to detect a state quantity of the battery, and a generator configured to generate a power to be supplied to the battery. The control apparatus includes circuitry configured to execute a normal charging control to control a charging of the battery on the basis of a detection result from the battery sensor, by controlling an operation of the generator. The circuitry executes a failsafe control to prioritize charging the battery regardless of the detection result from the battery sensor, in a case where the battery sensor is determined to be operating abnormally. The circuitry executes a full charging control to charge the battery until the battery is fully charged, when the failsafe control ends. The circuitry executes the normal charging control after a value of a state-of-charge of the battery used in the normal charging control is set to a value corresponding to a state where the battery is fully charged, when the full charging control ends.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 7 is a schematic diagram of an example of a shift in an actual SOC in a case where charging control is performed by the control apparatus according to the embodiment.

DETAILED DESCRIPTION

Figure 1:
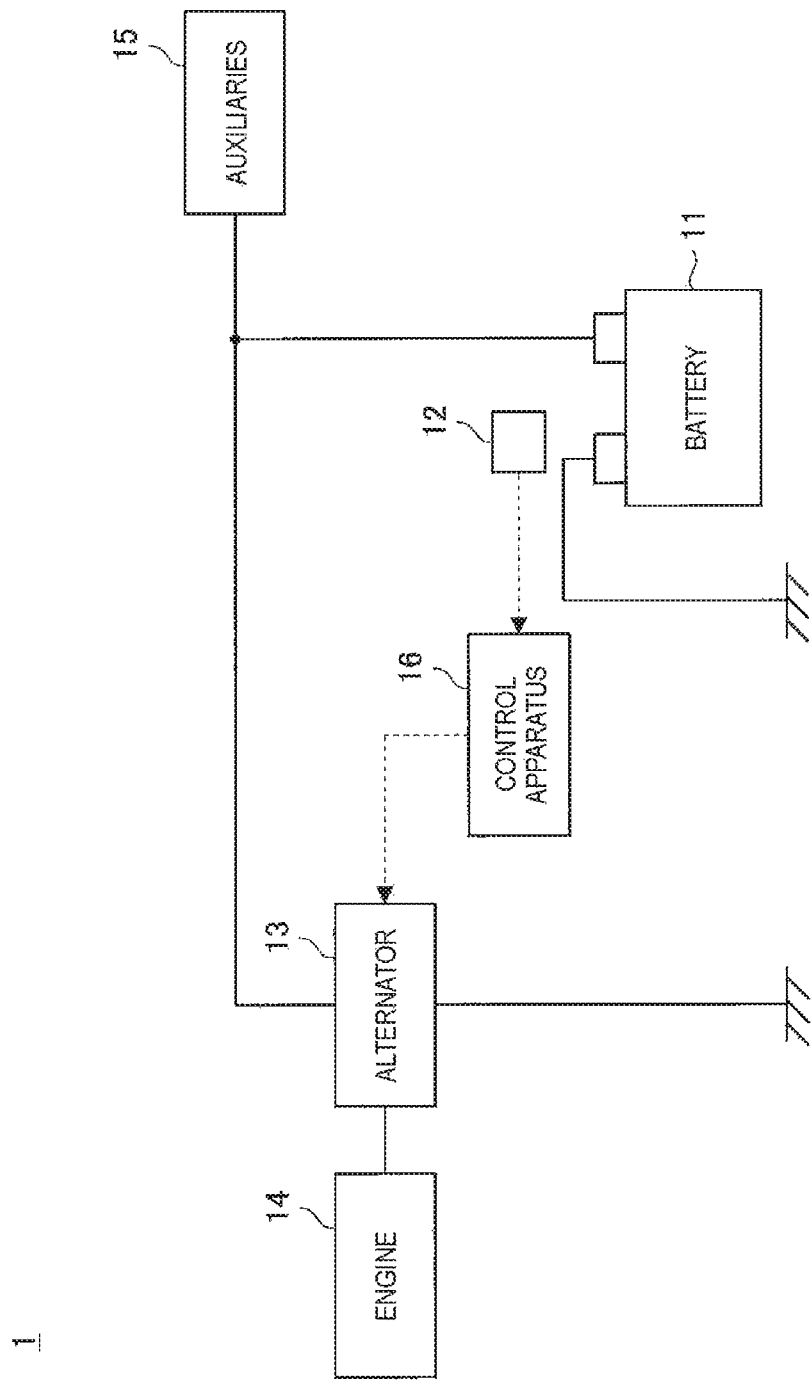
FIG. 1 is a schematic diagram of the general configuration of a power supply system according to one embodiment the disclosure.

In the following, a preferred but non-limiting embodiment of the disclosure is described in detail with reference to the accompanying drawings. Note that sizes, materials, specific values, and any other factors illustrated in the embodiment are illustrative for easier understanding of the disclosure, and are not intended to limit the scope of the disclosure unless otherwise specifically stated. Further, elements in the following example embodiment which are not recited in a most-generic independent claim of the disclosure are optional and may be provided on an as-needed basis. Throughout the present specification and the drawings, elements having substantially the same function and configuration are denoted with the same reference numerals to avoid any redundant description. Further, elements that are not directly related to the disclosure are unillustrated in the drawings. The drawings are schematic and are not intended to be drawn to scale.

When a battery sensor is operating abnormally, the reliability of the detection results from the battery sensor is lower than it is when the battery sensor is operating normally, so it becomes difficult to properly perform charging control based on the detection results from the battery sensor. Therefore, in a case where it has been determined that the battery sensor is operating abnormally, a failsafe control may be performed which prioritizes charging the battery regardless of the detection results from the battery sensor, in order to inhibit the battery power from becoming depleted. In a case where such failsafe control is performed, it may be difficult to properly charge the battery with conventional charging control.

For example, with conventional charging control, normal charging control, i.e., charging control during normal operation for charging the battery on the basis of the detection results from the battery sensor, is executed when the battery sensor returns to operating normally and the failsafe control ends. Specifically, with normal charging control, the charging of the battery is controlled using a value of the state of charge (hereinafter, also referred to as "SOC") of the battery. For example, the charging of the battery is controlled such that the SOC approaches a target state of charge (hereinafter, also referred to as "target SOC"). Here, the value of the SOC is acquired by integrating the detection value of the battery current detected by the battery sensor, so it is difficult to properly acquire the value of the actual SOC during failsafe control performed when the battery sensor is operating abnormally. Therefore, a case may arise in which it is difficult to charge the battery properly due to the value of the SOC used in normal charging control performed after failsafe control has ended deviating from the value of the actual SOC.

Therefore, it is desirable to provide a new and improved control apparatus of a power supply system, which enables a battery to be properly charged.

1. Configuration of Power Supply System

First, the configuration of a power supply system 1 according to one example of the disclosure will be described with reference to FIG. 1 to FIG. 3.

FIG. 1 is a schematic diagram of the general configuration of the power supply system 1 according to the present example. FIG. 2 is a block diagram of an example of the functional configuration of a battery sensor 12 according to the present example. FIG. 3 is a block diagram of an example of the functional configuration of a control apparatus 16 according to the present example.

Specifically, the power supply system 1 is mounted in a vehicle and used to supply power to each device in the vehicle. Note that the power supply system 1 is merely an example of the power supply system according to the disclosure; the power supply system according to the disclosure may be mounted in another device other than a vehicle.

The power supply system 1 is provided with a battery 11, a battery sensor 12, an alternator 13, and a control apparatus 16, as illustrated in FIG. 1. In addition, the power supply system 1 is provided with an engine 14 and auxiliaries 15. The alternator 13 corresponds to an example of a generator according to the disclosure, which generates power to be supplied to the battery 11. The vehicle equipped with the power supply system 1 is a vehicle that runs using the engine 14 as a drive source.

The battery 11 is a secondary battery capable of charging and discharging power. As the battery 11, a lithium-ion battery, a lithium-ion polymer battery, a nickel hydride battery, a nickel cadmium battery, or a lead battery, for example, is used, but a battery other than these may be used.

Specifically, the battery 11 is coupled to various auxiliaries 15 in the vehicle, and stores power to be supplied to the auxiliaries 15. The auxiliaries 15 include, for example, a starter motor, not illustrated in the drawings, for starting the engine 14, and the engine 14 is started by the starter motor being driven using power from the battery 11.

Also, the battery 11 is coupled to the alternator 13, and the battery 11 is charged by power generated by the alternator 13 being supplied to the battery 11.

The battery sensor 12 detects state quantities (e.g., current, voltage, temperature, and SOC) of the battery 11. Note that in the description below, the function of the battery sensor 12 is described with reference to FIG. 2, but the function of the battery sensor 12 may be at least partially divided among a plurality of sensors, or a plurality of functions may be realized by a single sensor.

Figure 2:
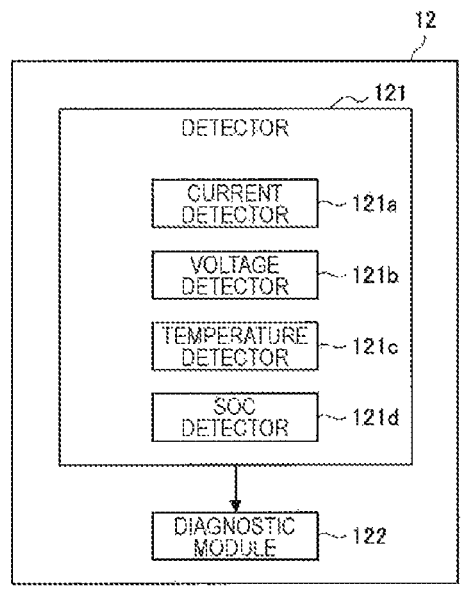
FIG. 2 is a block diagram of an example of the functional configuration of a battery sensor according to the embodiment.

For example, the battery sensor 12 has a detector 121 and a diagnostic module 122, as illustrated in FIG. 2.

The detector 121 detects the state quantities of the battery 11. The detection result from the detector 121 is output to the control apparatus 16 and used in processing performed by the control apparatus 16. Also, the detector 121 outputs the detection result to the diagnostic module 122.

For example, the detector 121 includes a current detector 121a, a voltage detector 121b, a temperature detector 121c, and a SOC detector 121d. The current detector 121a detects the current of the battery 11 (specifically, the current flowing into the battery 11 or the current flowing out from the battery 11). The voltage detector 121b detects the voltage of the battery 11 (specifically, the electrode voltage of the battery 11). The temperature detector 121c detects the temperature of the battery 11. The SOC detector 121d detects the SOC of the battery 11. Specifically, the SOC detector 121d acquires the value of the SOC of the battery 11 by integrating the detection value of the current of the battery 11.

The diagnostic module 122 detects an abnormality of the battery sensor 12. The detection result from the diagnostic module 122 is outputted to the control apparatus 16 and used in processing performed by the control apparatus 16.

Specifically, the diagnostic module 122 diagnoses the abnormality of the battery sensor 12 on the basis of the detection result from the detector 121.

For example, the diagnostic module 122 diagnoses the battery sensor 12 as operating abnormally in a case where a state in which at least one of the detection value of the current, the detection value of the voltage, the detection value of the temperature, or the detection value of the SOC of the battery 11 is excessively large or small has continued for equal to or longer than a reference time. The diagnostic module 122 determines that the detection value is excessively large or small in a case where the detection value takes on a value outside of a normally assumed range, for example. Note that the reference time described above is set, as appropriate, to a period of time within which it is possible to properly diagnose whether the battery sensor 12 is operating abnormally, for example.

Also, for example, the diagnostic module 122 diagnoses the battery sensor 12 as operating abnormally in a case where a state in which at least one variation amount of the detection value of the current, the detection value of the voltage, the detection value of the temperature, or the detection value of the SOC of the battery 11 is excessively small has continued for equal to or longer than a reference time. The diagnostic module 122 determines that the variation amount of the detection value is excessively small in a case where the variation amount per unit time of the detection value is equal to or less than a reference value, for example. Note that the reference time described above is set, as appropriate, to a period of time within which it is possible to properly diagnose whether the battery sensor 12 is operating abnormally, for example.

Note that, from the viewpoint of properly diagnosing an abnormality of the battery sensor 12, the diagnostic module 122 preferably diagnoses the battery sensor 12 as operating abnormally in a case where at least one of a state in which at least one detection value is excessively large or small has continued for equal to or longer than a reference time, or a state in which at least one variation amount of the detection value is excessively small has continued for equal to or longer than a reference time, is satisfied.

The alternator 13 generates power by being driven by power outputted from the engine 14. Specifically, the alternator 13 is coupled to an output shaft of the engine 14, and power outputted from the engine 14 is inputted to the alternator 13 via the output shaft. Also, the alternator 13 is provided with a regulator, not illustrated in the drawings, and voltage and current of the power generated by the alternator 13 is controlled by controlling the operation of the regulator.

Note that the alternator 13 may be directly coupled to the output shaft of the engine 14, or may be indirectly coupled to the output shaft of the engine 14 via a pulley and a belt, for example. Also, the alternator 13 can also generate power (regenerative power generation) using the rotational energy of the wheels when the vehicle is decelerating.

The control apparatus 16 is formed of a central processing unit (CPU) which is an calculation processor, read only memory (ROM) which is a storage element that stores calculation parameters and programs used by the CPU and the like, and random access memory (RAM) which is a storage element that temporarily stores parameters and the like that change, as appropriate, in the execution by the CPU, and the like.

Also, the control apparatus 16 communicates with each of the devices provided in the power supply system 1. Communication between the control apparatus 16 and each of the devices is realized using Controller Area Network (CAN) communication, for example.

Note that the function of the control apparatus 16 according to the present example may be at least partially divided among a plurality of control apparatuses, or a plurality of functions may be realized by a single control apparatus. In a case where the function of the control apparatus 16 is at least partially divided among a plurality of control apparatuses, the plurality of control apparatuses may be coupled together via a communication bus such as CAN.

Figure 3:
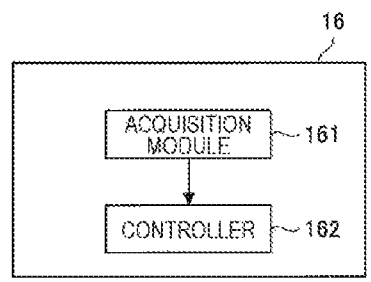
FIG. 3 is a block diagram of an example of the functional configuration of a control apparatus according to the embodiment.

As illustrated in FIG. 3, the control apparatus 16 is provided with an acquisition module 161 and a controller 162, for example.

The acquisition module 161 acquires various types of information used in processing performed by the control apparatus 16. Also, the acquisition module 161 outputs the acquired information to the controller 162. For example, the acquisition module 161 acquires various types of information outputted from the battery sensor 12 by communicating with the battery sensor 12.

The controller 162 mainly performs charging control of the battery 11 by controlling the operation of the alternator 13. Specifically, the controller 162 can control the voltage and current of the power generated by the alternator 13, by controlling the operation of the regulator of the alternator 13. As a result, charging of the battery 11 is controlled.

When the battery sensor 12 is operating normally, the controller 162 executes normal charging control that controls the charging of the battery 11 on the basis of the detection result from the battery sensor 12. For example, in the normal charging control, the controller 162 controls the current of the power generated by the alternator 13, on the basis of the detection value of the current and the detection value of the temperature of the battery 11. Also, for example, in the normal charging control, the controller 162 controls the voltage of the power generated by the alternator 13, on the basis of the detection value of the voltage and the detection value of the temperature of the battery 11.

Here, in the normal charging control, the controller 162 controls the charging of the battery 11 using the value of the SOC of the battery 11. For example, in the normal charging control, the controller 162 controls the charging of the battery 11 such that the SOC of the battery 11 approaches the target SOC. As the value of the SOC used in the normal charging control, the detection value of the SOC detected by the SOC detector 121$d$ of the battery sensor 12, for example, is used. Note that the value of the SOC used in the normal charging control may be acquired on the control apparatus 16 side, and in this case, the control apparatus 16 can acquire the value of the SOC by integrating the detection value of the current of the battery 11 detected by the current detector 121$a$ of the battery sensor 12, for example.

In a case where it has been determined that the battery sensor 12 is operating abnormally, the controller 162 according to the present example executes a failsafe control which prioritizes charging the battery 11 regardless of the detection result from the battery sensor 12. Then, in the present example, the battery 11 is able to be properly charged by charging control performed by the controller 162 after the failsafe control has ended. Note that the details of the processing performed by the controller 162 such as the charging control after the failsafe control has ended will be described later.

2. Operation of Control Apparatus

Next, the operation of the control apparatus 16 according to the example of the disclosure will be described with reference to FIG. 4 to FIG. 7.

Figure 4:
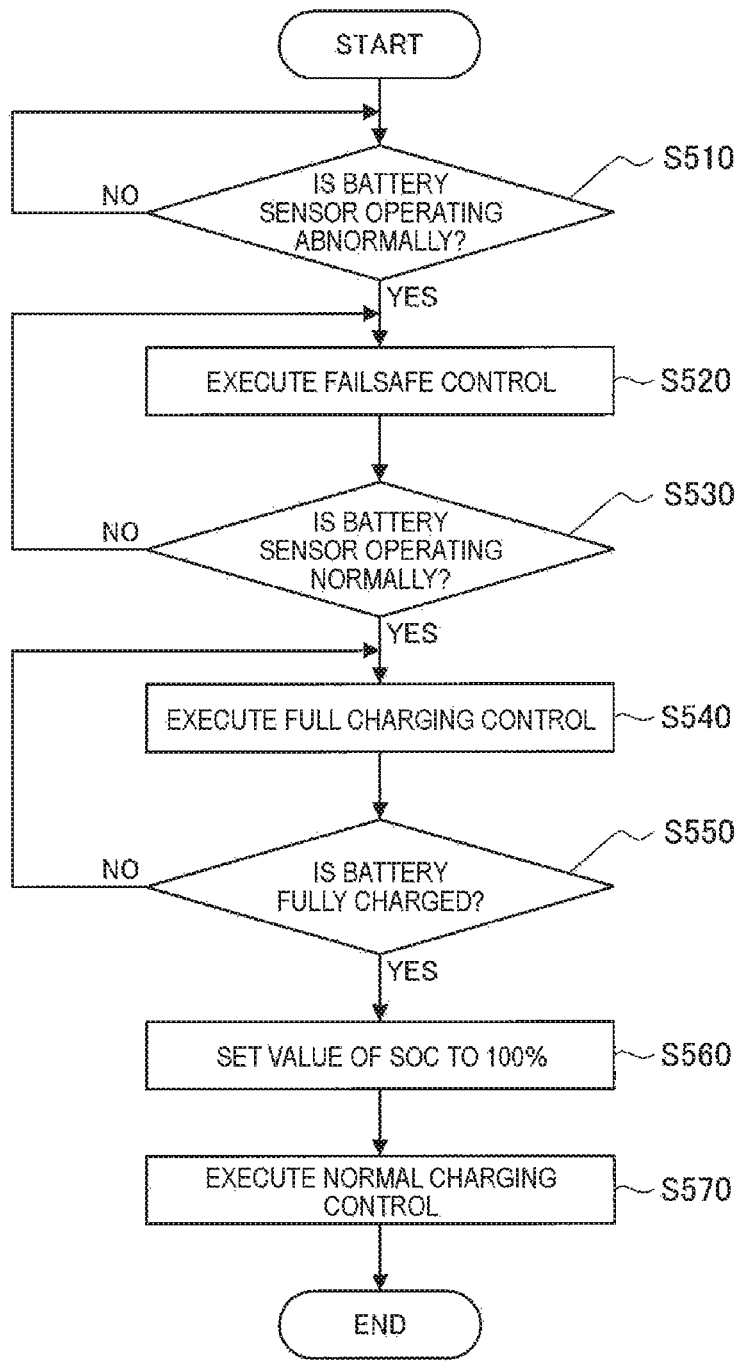
FIG. 4 is a flowchart illustrating an example of a flow of processing performed by the control apparatus according to the embodiment.

FIG. 4 is a flowchart illustrating an example of a flow of processing performed by the control apparatus 16 according to the present example. Specifically, the control flow illustrated in FIG. 4 starts when the normal charging control is executed by the control apparatus 16. Also, the control flow illustrated in FIG. 4 is repeated after the power supply system 1 is activated, for example.

When the control flow illustrated in FIG. 4 starts, first, in step S510, the controller 162 determines whether the battery sensor 12 is operating abnormally. If it is determined that the battery sensor 12 is operating abnormally (YES in step S510), the processing proceeds on to step S520. However, if it is determined that the battery sensor 12 is operating normally (NO in step S510), the determination processing of step S510 is repeated.

For example, the controller 162 may determine that the battery sensor 12 is operating abnormally on the basis of a diagnostic result from the diagnostic module 122 of the battery sensor 12. Here, from the viewpoint of more appropriately determining an abnormality of the battery sensor 12, the controller 162 preferably diagnoses abnormal operation of the battery sensor 12 on the basis of the detection result from the battery sensor 12, separately from the diagnosis by the diagnostic module 122 of the battery sensor 12, and determines whether the battery sensor 12 is operating abnormally on the basis of both the diagnostic result regarding an abnormality of the battery sensor 12 on the battery sensor 12 side and the diagnostic result regarding an abnormality of the battery sensor 12 on the control apparatus 16 side. The controller 162 can diagnose an abnormality of the battery sensor 12 by performing processing similar to the diagnostic processing by the diagnostic module 122 of the battery sensor 12, for example.

Figure 5:
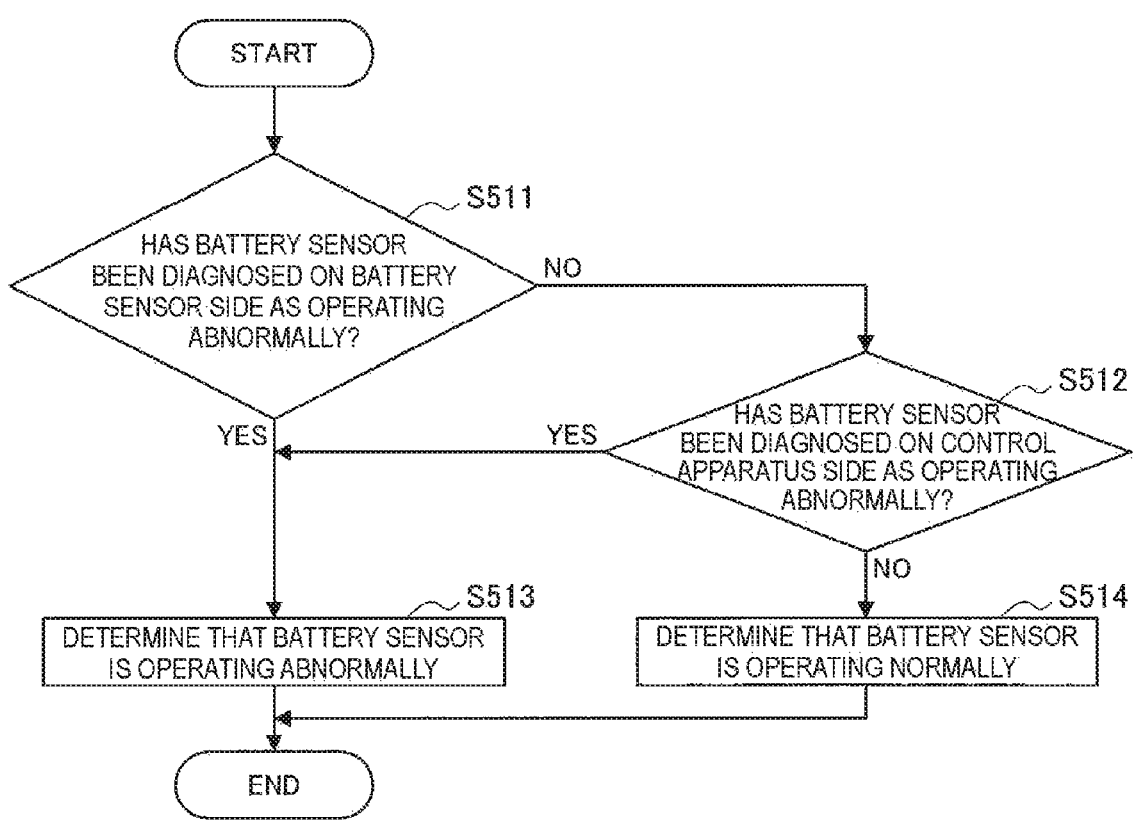
FIG. 5 is a flowchart illustrating an example of a flow of processing related to an abnormality determination performed by the control apparatus according to the embodiment.

Hereinafter, an example of processing in a case where a determination as to whether the battery sensor 12 is operating abnormally (hereinafter, also referred to as "abnormality determination") is made on the basis of both the diagnostic result regarding an abnormality of the battery sensor 12 on the battery sensor 12 side and the diagnostic result regarding an abnormality of the battery sensor 12 on the control apparatus 16 side, will be described in detail with reference to FIG. 5. FIG. 5 is a flowchart illustrating an example of a flow of processing related to the abnormality determination performed by the control apparatus 16 according to the present example. Specifically, the control flow illustrated in FIG. 5 corresponds to an example of the processing in step S510 in the control flow illustrated in FIG. 4.

When the control flow illustrated in FIG. 5 starts, first, in step S511, the controller 162 determines whether the battery sensor 12 has been diagnosed on the battery sensor 12 side as operating abnormally. If it is determined that the battery sensor 12 has been diagnosed on the battery sensor 12 side as operating abnormally (YES in step S511), the processing proceeds on to step S513. However, if it is determined that the battery sensor 12 has not been diagnosed on the battery sensor 12 side as operating abnormally (NO in step S511), the processing proceeds on to step S512.

If the determination in step S511 is NO, the controller 162 determines in step S512 whether the battery sensor 12 has been diagnosed on the control apparatus 16 side as operating abnormally. If it is determined that the battery sensor 12 has been diagnosed on the control apparatus 16 side as operating abnormally (YES in step S512), the processing proceeds on to step S513. However, if it is determined that the battery sensor 12 has not been diagnosed on the control apparatus 16 side as operating abnormally (NO in step S512), the processing proceeds on to step S514.

If the determination in step S511 or step S512 is YES, the controller 162 determines in step S513 that the battery sensor 12 is operating abnormally. However, if the determination in step S512 is NO, the controller 162 determines in step S514 that the battery sensor 12 is operating normally. After step S513 or step S514, the control flow illustrated in FIG. 5 ends.

Hereinafter, the processing in steps S520 and thereafter in the control flow illustrated in FIG. 4 will be described.

If the determination in step S510 is YES, the controller 162 executes the failsafe control in step S520. The failsafe control is control which prioritizes charging the battery 11 regardless of the detection result from the battery sensor 12, as described above. Specifically, in the failsafe control, the controller 162 continuously charges the battery 11 by causing the alternator 13 to continuously generate power when the alternator 13 is being driven. Here, when the battery sensor 12 is operating abnormally, the reliability of the detection values of the various state quantities of the battery 11 detected by the battery sensor 12 is lower than it is when the battery sensor 12 is operating normally, so in the failsafe control, the controller 162 controls the current and voltage of the power generated by the alternator 13 to preset target values.

If the reliability of the detection results of the various state quantities of the battery 11 detected by the battery sensor 12 is lower than it is when the battery sensor 12 is operating normally, it becomes difficult to properly perform normal charging control that controls the charging of the battery 11 on the basis of the detection results from the battery sensor 12. In such a case, if charging of the battery 11 is prohibited, or if charging control is performed using the value of the SOC acquired on the basis of the detection value of the current of the battery 11 that is unreliable, the power of the battery 11 may become depleted. Therefore, by performing the failsafe control, a decrease in the actual SOC of the battery 11 can be suppressed, and consequently, the power of the battery 11 can be inhibited from becoming depleted.

Next, in step S530, the controller 162 determines whether the battery sensor 12 is operating normally. If it is determined that the battery sensor 12 is operating normally (YES in step S530), the processing proceeds on to step S540. However, if it is determined that the battery sensor 12 is operating abnormally (NO in step S530), the processing returns to step S520 and the failsafe control continues to be executed.

Specifically, in step S530, the controller 162 determines whether the battery sensor 12 is operating normally by performing processing similar to the abnormality determination processing in step S510.

If the determination in step S530 is YES, the controller 162 ends the failsafe control, and executes full charging control in step S540. Full charging control is control that charges the battery 11 until the battery 11 is fully charged. Specifically, in the full charging control, the controller 162 continuously charges the battery 11 by causing the alternator 13 to continuously generate power when the alternator 13 is being driven. Here, when the battery sensor 12 is operating normally, the reliability of the detection values of the various state quantities of the battery 11 detected by the battery sensor 12 has returned from being low, so in the full charging control, the controller 162 controls the current and voltage of the power generated by the alternator 13 on the basis of the detection results of the battery sensor 12. Consequently, in the full charging control, the battery 11 can be charged more appropriately than it can during failsafe control.

Next, in step S550, the controller 162 determines whether the battery 11 is fully charged. If it is determined that the battery 11 is fully charged (YES in step S550), the processing proceeds on to step S560. However, if it is determined that the battery 11 is not fully charged (NO in step S560), the processing returns to step S540, and the full charging control continues to be executed.

Here, from the viewpoint of properly determining whether the battery 11 is fully charged, in the full charging control, the controller 162 preferably determines whether the battery 11 is fully charged on the basis of the detection value of the voltage and the detection value of the current of the battery 11 detected by the battery sensor 12.

For example, the controller 162 determines that the battery 11 is fully charged if a state in which the detection value of the voltage of the battery 11 exceeds a reference voltage value, and the detection value of the current of the battery 11 is below a reference current value, has continued for a reference time or longer. Note that the reference current value described above is set, as appropriate, to a value by which it is possible to properly determine whether the battery 11 is charging, for example. The reference current value described above is set, as appropriate, to a value by which it is possible to properly determine whether the voltage of the battery 11 is high enough to be able to charge the battery 11 in a case where the battery 11 is not fully charged, for example. The reference time described above is set, as appropriate, to a period of time within which it is possible to properly determine whether the battery 11 is fully charged, for example.

If the determination in step S550 is YES, the controller 162 ends the full charging control, and sets the value of the SOC used in the normal charging control to a value corresponding to fully charged (100% for example) in step S560.

Next, in step S570, the controller 162 executes the normal charging control.

Next, the control flow illustrated in FIG. 4 ends.

Here, a shift in the actual SOC of the battery 11 in a case where charging control is performed by a control apparatus according to a reference example and the control apparatus 16 according to the present example will be described with reference to FIG. 6 and FIG. 7.

Figure 6:
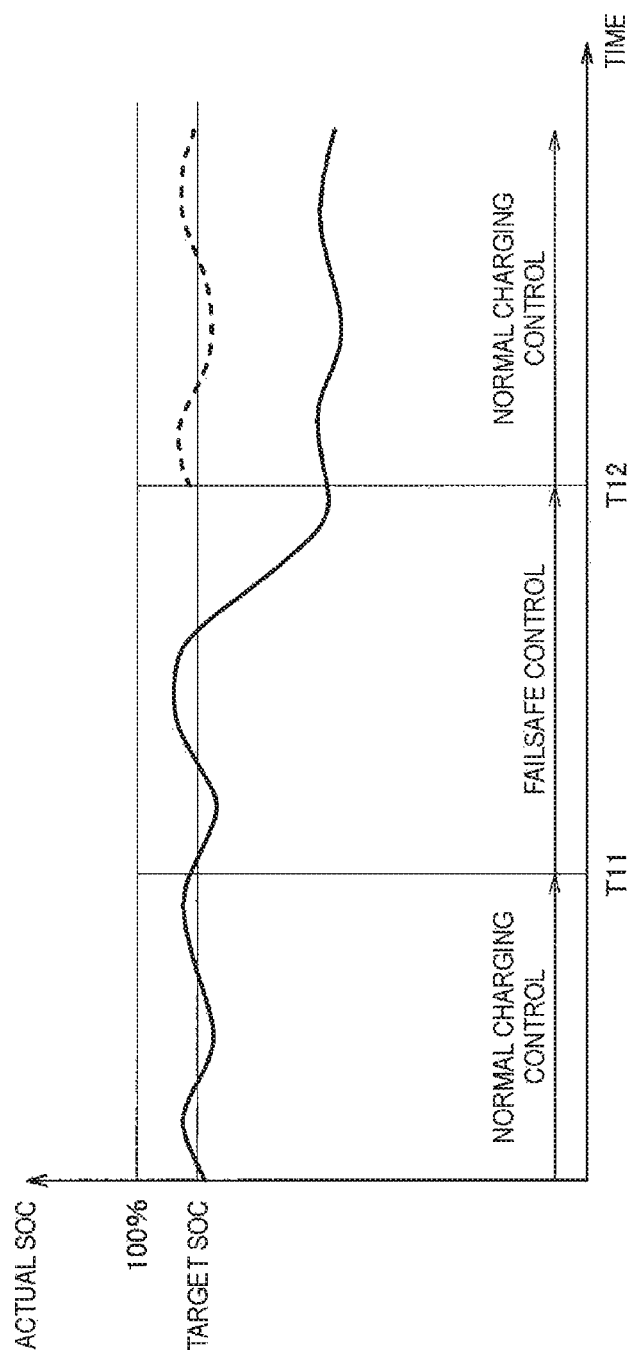
FIG. 6 is a schematic diagram of an example of a shift in an actual SOC in a case where charging control is performed by the control apparatus according to a reference example.

FIG. 6 is a schematic diagram of an example of a shift in the actual SOC in a case where charging control is performed by the control apparatus according to the reference example. In FIG. 6, the shift in the actual SOC in a case where the battery sensor 12 that was operating normally before time T11 operates abnormally at time T11 and then returns to operating normally at time T12, is indicated by the solid line.

When the battery sensor 12 is operating normally, the control apparatus according to the reference example executes normal charging control that controls the charging of the battery 11 on the basis of the detection result from the battery sensor 12, similar to the control apparatus 16 according to the present example. More specifically, in the normal charging control, the charging of the battery 11 is controlled such that the SOC of the battery 11 approaches the target SOC. Also, in a case where it has been determined that the battery sensor 12 is operating abnormally, the control apparatus according to the reference example executes a failsafe control which prioritizes charging the battery 11 regardless of the detection result from the battery sensor 12, similar to the control apparatus 16 according to the present example.

However, the control apparatus according to the reference example executes the normal charging control without executing the full charging control, when the failsafe control ends, which is different from the control apparatus 16 according to the present example.

Before time T11, the normal charging control is executed and the actual SOC is maintained at a value close to the target SOC, as illustrated in FIG. 6. Here, at time T11, the failsafe control is executed in response to a determination that the battery sensor 12 is operating abnormally. Consequently, after time T11, charging of the battery 11 is performed regardless of the detection result from the battery sensor 12. Here, after time T11, the reliability of the detection values of the various state quantities of the battery 11 detected by the battery sensor 12 is lower than it is when the battery sensor 12 is operating normally, so it is difficult to properly acquire the value of the actual SOC during the failsafe control.

Then, at time T12, the normal charging control is executed in response to a determination that the battery sensor 12 is operating normally. Here, in the reference example, the normal charging control resumes from time T12, with the value at time T11, which is when the last normal charging control ended, used as the value of the SOC to be used in normal charging control, for example. In FIG. 6, the value of the SOC used in the normal charging control after time T12 is indicated by the broken line.

However, the values of the actual SOC at the start and end of the failsafe control do not always match, as illustrated in FIG. 6. For example, in a case where the battery sensor 12 returns to operating normally when the vehicle is caused to park in a state in which the battery sensor 12 is operating abnormally and then starts traveling again, the value of the actual SOC when the failsafe control ends (that is, when the vehicle starts traveling again) may be lower than it was when the failsafe control started, due to natural discharge when the vehicle was parked or the like. Therefore, in the reference example, there are cases where the value of the SOC used in the normal charging control performed after the failsafe control ends deviates from the value of the actual SOC. In this case, it is difficult to properly charge the battery. For example, in the example illustrated in FIG. 6, the actual SOC ends up being maintained at a lower value than the target SOC after time T12 due to the fact that the value of the SOC used in the normal charging control performed after the failsafe control ends is higher than the value of the actual SOC.

FIG. 7 is a schematic diagram of an example of a shift in the actual SOC in a case where charging control is performed by the control apparatus 16 according to the present example. In FIG. 7, the shift in the actual SOC in a case where the battery sensor 12 that was operating normally before time T11 operates abnormally at time T11 and then returns to operating normally at time T12, similar to the example illustrated in FIG. 6, is indicated by the solid line. Note that in the example illustrated in FIG. 7, the shift in the actual SOC up until time T12 is similar to that in the example illustrated in FIG. 6.

As described above, in the present example, when the failsafe control ends, the controller 162 executes full charging control that charges the battery 11 until the battery 11 is fully charged, and when the full charging control ends, the controller 162 executes the normal charging control after setting the value of the SOC of the battery 11 used in the normal charging control to a value corresponding to fully charged.

In the present example, the full charging control is executed in response to the failsafe control ending at time T12, as illustrated in FIG. 7. Therefore, the actual SOC rises after time T12. Then, at time T13, the full charging control ends in response to a determination that the battery 11 is fully charged. Here, in the present example, at time T13, the normal charging control is executed after the value of the SOC of the battery 11 used in the normal charging control has been set to a value corresponding to fully charged (100% for example).

As described above, in the present example, at time T13, the value of the SOC of the battery 11 used in the normal charging control when the full charging control ends is set to a value corresponding to fully charged, so it is possible to inhibit the value of the SOC used in the normal charging control performed after the failsafe control ends from deviating from the value of the actual SOC. Therefore, after time T13, the actual SOC can be maintained at a value close to the target SOC, similar to before time T11, as illustrated in FIG. 7.

3. Effects of the Control Apparatus

Next, the effects of the control apparatus 16 according to the example of the disclosure will be described.

With the control apparatus 16 according to the present example, the controller 162 executes the failsafe control which prioritizes charging the battery 11 regardless of the detection result from the battery sensor 12, in a case where it has been determined that the battery sensor 12 is operating abnormally. Also, after the failsafe control ends, the controller 162 executes the full charging control that charges the battery 11 until the battery 11 is fully charged. Also, when the full charging control ends, the controller 162 executes the normal charging control after setting the value of the SOC of the battery 11 used in the normal charging control to a value corresponding to fully charged. As a result, it is possible to inhibit the value of the SOC used in the normal charging control performed after the failsafe control ends from deviating from the value of the actual SOC. Therefore, it is possible to properly charge the battery.

Also, with the control apparatus 16 according to the present example, in the normal charging control, the controller 162 preferably controls the charging of the battery 11 such that the SOC of the battery 11 approaches the target SOC. As a result, when the battery sensor 12 is operating normally, it is possible to inhibit excessive power generation for charging the battery 11, while the power of the battery 11 is inhibited from becoming depleted. Therefore, fuel consumption of a vehicle equipped with the power supply system 1 can be improved, for example. In the present example, in the normal charging control, the charging of the battery 11 is controlled using the value of the SOC as described above, for example, so it is possible to realize proper charging of the battery 11 by inhibiting the value of the SOC used in the normal charging control performed after the failsafe control ends from deviating from the value of the actual SOC.

Also, with the control apparatus 16 according to the present example, in the full charging control, the controller 162 preferably determines whether the battery 11 is fully charged on the basis of the detection value of the voltage and the detection value of the current of the battery 11 detected by the battery sensor 12. As a result, it is possible to properly determine whether the battery 11 is fully charged by suitably using the detection results from the battery sensor 12 that have become reliable again.

Also, with the control apparatus 16 according to the present example, the controller 162 preferably diagnoses an abnormality of the battery sensor 12 on the basis of the detection result from the battery sensor 12, separately from the diagnosis by the diagnostic module 122 of the battery sensor 12, and determines whether the battery sensor 12 is operating abnormally on the basis of both the diagnostic result regarding an abnormality of the battery sensor 12 on the battery sensor 12 side and the diagnostic result regarding an abnormality of the battery sensor 12 on the control apparatus 16 side. Here, for example, there are cases where a reference value used in the diagnosis on the battery sensor 12 side (for example, a threshold value used to determine whether the detection value is excessively large or small, or the like) is different from a reference value used in the diagnosis on the control apparatus 16 side. Therefore, the accuracy of the determination of whether the battery sensor 12 is operating abnormally can be improved compared to a case where the determination as to whether the battery sensor 12 is operating abnormally is made on the basis of only the diagnostic result regarding an abnormality of the battery sensor 12 on the battery sensor 12 side, for example. Therefore, it is possible to properly determine whether the battery sensor 12 is operating abnormally.

4. Conclusion

As described above, with the control apparatus 16 according to the present example, when the failsafe control ends, the controller 162 executes the full charging control that charges the battery 11 until the battery 11 is fully charged, and when the full charging control ends, the controller 162 executes the normal charging control after setting the value of the SOC of the battery 11 used in the normal charging control to a value corresponding to fully charged. As a result, it is possible to inhibit the value of the SOC used in the normal charging control performed after the failsafe control ends from deviating from the value of the actual SOC, so the battery 11 can be properly charged.

Although the preferred examples of the disclosure have been described in detail with reference to the appended drawings, the disclosure is not limited thereto. It is obvious to those skilled in the art that various modifications or variations are possible insofar as they are within the technical scope of the appended claims or the equivalents thereof. It should be understood that such modifications or variations are also within the technical scope of the disclosure.

Note that it is not necessary for the processing described in this specification with reference to the flowchart to be executed in the order illustrated in the flowchart. Some processing steps may be performed in parallel. Further, some of additional steps can be adopted, or some processing steps can be omitted.

Also, for example, in the description above, an example was described in which the vehicle equipped with the power supply system 1 is a vehicle that travels using the engine 14 as the drive source, but the vehicle equipped with the power supply system provided with the control apparatus according to the disclosure is not particularly limited to such an example. For example, a vehicle equipped with a power supply system provided with the control apparatus according to the disclosure may be a hybrid vehicle having an engine and a motor as drive sources.

The invention claimed is:

1. A control apparatus of a power supply system comprising a battery, a battery sensor configured to detect a state quantity of the battery, and a generator configured to generate a power to be supplied to the battery, the control apparatus comprising:
   a controller configured to execute a normal charging control to control a charging of the battery on a basis of a detection result from the battery sensor, by controlling an operation of the generator,
   wherein the controller
      executes a failsafe control to prioritize charging the battery regardless of the detection result from the battery sensor, in a case where the battery sensor is determined to be operating abnormally,
      executes a full charging control to charge the battery until the battery is fully charged, when the failsafe control ends, and
      executes the normal charging control after a value of a state-of-charge of the battery used in the normal charging control is set to a value corresponding to a state where the battery is fully charged, when the full charging control ends.

2. The control apparatus of a power supply system according to claim 1, wherein
   in the normal charging control, the controller controls the charging of the battery such that the state-of-charge of the battery approaches a target state-of-charge.

3. The control apparatus of a power supply system according to claim 1, wherein
   in the full charging control, the controller determines whether the battery is fully charged on a basis of a detection value of a voltage and a detection value of a current of the battery that are detected by the battery sensor.

4. The control apparatus of a power supply system according to claim 2, wherein
   in the full charging control, the controller determines whether the battery is fully charged on a basis of a detection value of a voltage and a detection value of a current of the battery that are detected by the battery sensor.

5. The control apparatus of a power supply system according to claim 1, wherein the battery sensor comprises a diagnostic module configured to diagnose an abnormality of the battery sensor on the basis of the detection result from the battery sensor, and the controller diagnoses the abnormality of the battery sensor on the basis of the detection result from the battery sensory, separately from the diagnosis by the diagnostic module of the battery sensor, and determines whether the battery module is operating abnormally on a basis of both the diagnostic result regarding an abnormality of the battery sensor on the battery sensor side and the diagnostic result regarding an abnormality of the battery sensor on the control apparatus side.

6. The control apparatus of a power supply system according to claim 2, wherein the battery sensor comprises a diagnostic module configured to diagnose an abnormality of the battery sensor on the basis of the detection result from the battery sensor, and the controller diagnoses the abnormality of the battery sensor on the basis of the detection result from the battery sensory, separately from the diagnosis by the diagnostic module of the battery sensor, and determines whether the battery module is operating abnormally on a basis of both the diagnostic result regarding an abnormality of the battery sensor on the battery sensor side and the diagnostic result regarding an abnormality of the battery sensor on the control apparatus side.

7. The control apparatus of a power supply system according to claim 3, wherein the battery sensor comprises a diagnostic module configured to diagnose an abnormality of the battery sensor on the basis of the detection result from the battery sensor, and the controller diagnoses the abnormality of the battery sensor on the basis of the detection result from the battery sensory, separately from the diagnosis by the diagnostic module of the battery sensor, and determines whether the battery module is operating abnormally on a basis of both the diagnostic result regarding an abnormality of the battery sensor on the battery sensor side and the diagnostic result regarding an abnormality of the battery sensor on the control apparatus side.

8. The control apparatus of a power supply system according to claim 4, wherein the battery sensor comprises a diagnostic module configured to diagnose an abnormality of the battery sensor on the basis of the detection result from the battery sensor, and the controller diagnoses the abnormality of the battery sensor on the basis of the detection result from the battery sensory, separately from the diagnosis by the diagnostic module of the battery sensor, and determines whether the battery module is operating abnormally on a basis of both the diagnostic result regarding an abnormality of the battery sensor on the battery sensor side and the diagnostic result regarding an abnormality of the battery sensor on the control apparatus side.

9. The control apparatus of a power supply system according to claim 1, wherein the power supply system is mounted in a vehicle, and is provided with an engine, and the generator is an alternator configured to generate a power by being driven by a power outputted from the engine.

10. The control apparatus of a power supply system according to claim 2, wherein the power supply system is mounted in a vehicle, and is provided with an engine, and the generator is an alternator configured to generate a power by being driven by a power outputted from the engine.

11. The control apparatus of a power supply system according to claim 3, wherein the power supply system is mounted in a vehicle, and is provided with an engine, and the generator is an alternator configured to generate a power by being driven by a power outputted from the engine.

12. The control apparatus of a power supply system according to claim 4, wherein the power supply system is mounted in a vehicle, and is provided with an engine, and the generator is an alternator configured to generate a power by being driven by a power outputted from the engine.

13. The control apparatus of a power supply system according to claim 5, wherein the power supply system is mounted in a vehicle, and is provided with an engine, and the generator is an alternator configured to generate a power by being driven by a power outputted from the engine.

14. The control apparatus of a power supply system according to claim 6, wherein the power supply system is mounted in a vehicle, and is provided with an engine, and the generator is an alternator configured to generate a power by being driven by a power outputted from the engine.

15. The control apparatus of a power supply system according to claim 7, wherein the power supply system is mounted in a vehicle, and is provided with an engine, and the generator is an alternator configured to generate a power by being driven by a power outputted from the engine.

16. The control apparatus of a power supply system according to claim 8, wherein the power supply system is mounted in a vehicle, and is provided with an engine, and the generator is an alternator configured to generate a power by being driven by a power outputted from the engine.

17. A control apparatus of a power supply system comprising a battery, a battery sensor configured to detect a state quantity of the battery, and a generator configured to generate a power to be supplied to the battery, the control apparatus comprising:

circuitry configured to execute a normal charging control to control a charging of the battery on a basis of a detection result from the battery sensor, by controlling an operation of the generator, wherein the circuitry
- executes a failsafe control to prioritize charging the battery regardless of the detection result from the battery sensor, in a case where the battery sensor is determined to be operating abnormally,
- executes a full charging control to charge the battery until the battery is fully charged, when the failsafe control ends, and
- executes the normal charging control after a value of a state-of-charge of the battery used in the normal charging control is set to a value corresponding to a state where the battery is fully charged, when the full charging control ends.

* * * * *